(12) United States Patent
Chen

(10) Patent No.: US 7,119,600 B2
(45) Date of Patent: Oct. 10, 2006

(54) WIDE COMMON MODE HIGH-SPEED DIFFERENTIAL RECEIVER USING THIN AND THICK GATE OXIDE MOSFETS IN DEEP-SUBMICRON TECHNOLOGY

(75) Inventor: Chung-Hui Chen, Hsin Chu (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 0 days.

(21) Appl. No.: 10/827,958

(22) Filed: Apr. 20, 2004

(65) Prior Publication Data

US 2005/0231261 A1    Oct. 20, 2005

(51) Int. Cl.
*H03K 5/22* (2006.01)

(52) U.S. Cl. .................. 327/333; 326/81; 330/253

(58) Field of Classification Search ................ 327/333, 327/89; 326/81, 30, 62, 63, 68, 80; 330/253
See application file for complete search history.

(56) References Cited

U.S. PATENT DOCUMENTS

| | | | | |
|---|---|---|---|---|
| 4,881,044 A * | 11/1989 | Kinoshita et al. | ........... | 330/253 |
| 5,142,168 A * | 8/1992 | Matsunaga | ................... | 326/90 |
| 5,939,922 A * | 8/1999 | Umeda | ........................ | 327/333 |
| 6,008,682 A * | 12/1999 | Mirov | ......................... | 327/333 |
| 6,683,498 B1 * | 1/2004 | Burns et al. | ................. | 330/261 |
| 6,898,128 B1 * | 5/2005 | Prinz et al. | ............ | 365/185.28 |
| 6,921,932 B1 * | 7/2005 | Yu et al. | ...................... | 257/256 |
| 6,933,225 B1 * | 8/2005 | Werkhoven et al. | ......... | 438/627 |
| 6,958,651 B1 * | 10/2005 | Kimura | ...................... | 330/253 |
| 6,985,022 B1 * | 1/2006 | Kanno et al. | ............... | 327/333 |
| 2001/0024137 A1 * | 9/2001 | Miura | ........................ | 327/333 |

* cited by examiner

*Primary Examiner*—Tuan T. Lam
(74) *Attorney, Agent, or Firm*—Duane Morris LLP

(57) ABSTRACT

A high speed receiver circuit is disclosed with a high supply voltage and operable with other circuits operating at a low supply voltage. The receiver circuit comprises first and second differential input signals controlling first and second current switches. It also includes a top current supply connected to the high supply voltage for providing a current to be passed either through the first current switch and a first bottom current supply or the second current switch and a second bottom current supply. Further included are first and second resistors connected to the low supply voltage and in a series with the first or second bottom current supplies respectively. First and second differential output signals are produced at a point between each pair of the resistors and the bottom current supply. A common mode voltage of the first and second differential output signals is lower than the low supply voltage.

5 Claims, 5 Drawing Sheets

WIDE COMMON MODE HIGH-SPEED DIFFERENTIAL RECEIVER USING THIN AND THICK GATE OXIDE MOSFETS IN DEEP-SUBMICRON TECHNOLOGY

BACKGROUND

The present invention relates generally to semiconductor devices, and more particularly, to high-speed receiver semiconductor devices. Still more particularly, the present invention relates to the circuit and method of using thin and thick film gate oxide MOSFETs to construct wide common mode, high-speed differential receivers, in deep sub-micron technology semiconductor devices.

Differential signaling has been utilized for many years as a data transmission method. A differential receiver converts and amplifies a differential input signal (IN+ and IN−) to a differential output signal (VOUT+ and VOUT−). These receivers offer high data transmission speeds, low noise coupling, and low EMI (electromagnetic interference). For embodiment, teletype equipment was some of the first types of equipment to use differential signaling to communicate. Today, computers often communicate between ports by low voltage differential signal (LVDS) drivers and receiver pairs. In addition to the LVDS data transmission technology, emitter coupled logic (ECL), common mode logic (CML), and hyper-transport (high-bandwidth chip-to-chip technology) technology are utilized for data transmission methods. Typical differential signal transmission speeds are over 100 Mbps (mega bits per second). In each of these transmission methods, high speed, wide common mode, voltage differential receivers are necessary building blocks to attain the required data transmission speeds while meeting the low noise coupling, and the low EMI requirements.

Semiconductor technology is evolving into the deep sub-micron geometries of less than 100 nanometers (nm). This technology is needed to produce today's portable devices such as cellular telephones, laptops, and other portable electronic devices. The smaller geometry gates of less than 100 nm offer more complex functionality and higher performance, but not without a cost. As the nanometer gate geometry becomes smaller, its power dissipation increases dramatically, hence the battery power drain increases significantly.

Conventional wide common mode, high-speed differential receivers utilize thick gate oxide MOSFETs in deep sub-micron technology devices for all required series amplifier stages. Each of these stages is designed to operate from high voltage power supplies (VDDH) of approximately 3.3VDC to maximize data transmission speeds. A final translation stage must be implemented to convert the 3.3VDC (VDDH) supply voltage to 1.2VDC (VDDL) to interface with the subsequent digital logic devices using the 1.2VDC (VDDL) supply voltage. These multiple high-speed receiver amplifier stages that use the VDDH supply voltage dissipate much more power than receivers that use the VDDL supply voltage.

Desirable in the art of wide common mode, high-speed receiver designs are additional designs that reduce power dissipation while still meeting or exceeding the high-speed data transmission requirements.

SUMMARY

In view of the foregoing, this invention provides a circuit and method of using both thin and thick film gate oxide MOSFETs to construct a wide common mode, high-speed differential receiver in deep sub-micron technology semiconductor devices.

In one embodiment of this invention, a circuit and method comprised of a pre-amplifier stage utilizing both thick and thin film MOSFETS is presented to minimize the circuit's power dissipation while meeting the high-speed data transmission requirements. Such a circuit has a high supply voltage and is operable with additional circuits operating at a low supply voltage. The receiver circuit comprises a first and second differential input signals controlling a first and second current switches. It also includes a top current supply connected to the high supply voltage for providing a current to be passed either through the first current switch and a first bottom current supply or the second current switch and a second bottom current supply. Further included are a first and second resistors connected to the low supply voltage and in series with the first or second bottom current supplies respectively. A first and second differential output signals are produced at a point between each pair of the resistors and the bottom current supply. A common mode voltage of the first and second differential output signals is lower than the low supply voltage.

Although the invention is illustrated and described herein as embodied in a circuit and method of using both thin and thick film gate oxide MOSFETs to construct wide common mode high-speed differential receivers in deep sub-micron technology semiconductor devices, it is, nevertheless, not intended to be limited to the details shown, since various modifications and structural changes may be made therein without departing from the spirit of the invention, and within the scope and range of equivalents of the claims.

The construction and method of operation of the invention, however, together with additional objects and advantages thereof, will be best understood from the following description of specific embodiments when read in connection with the accompanying drawings.

DESCRIPTION

In the present invention, a circuit and method comprised of a pre-amplifier stage utilizing both thick and thin film MOSFETs is presented to minimize the high-speed differential receiver circuit's power dissipation while meeting the high-speed data transmission requirements, and also provide supply voltage translation from a high supply voltage VDDH, to a low supply voltage VDDL, for subsequent amplifier stages and digital logic.

Figure 1:
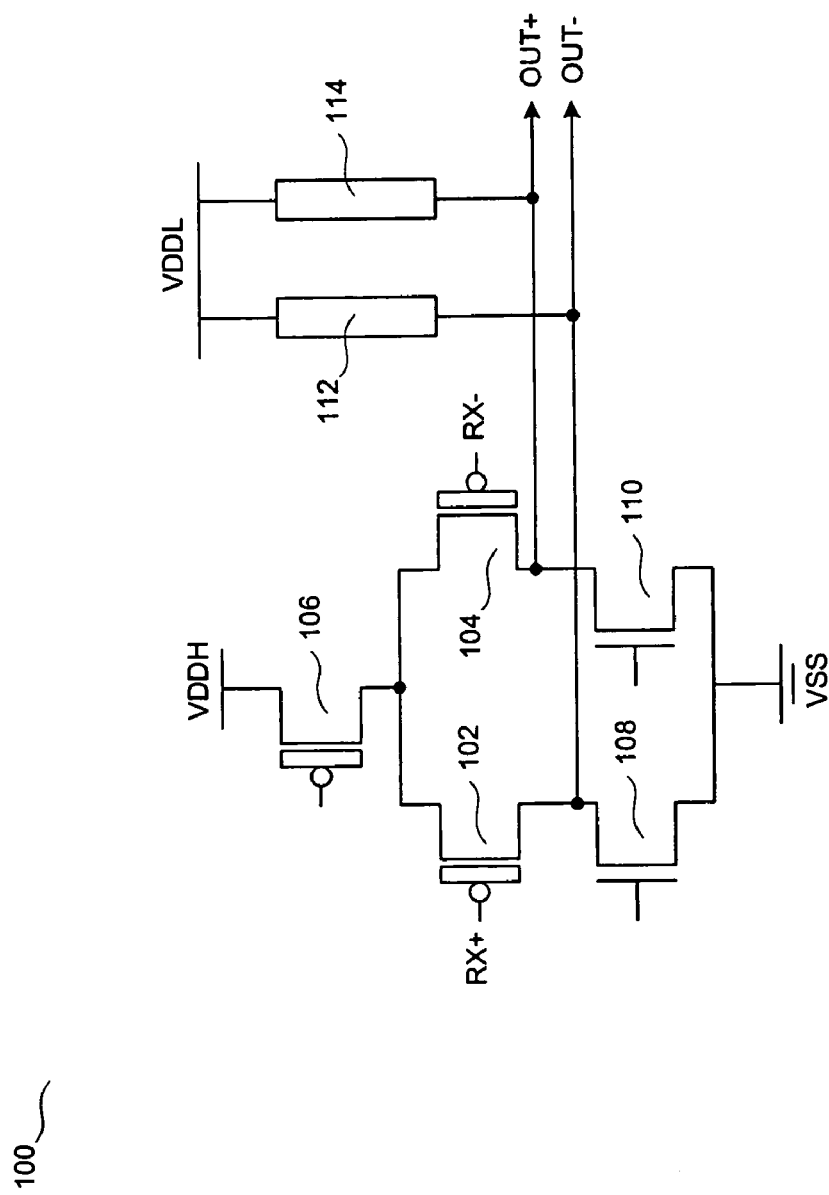
FIG. 1 presents a wide common mode, high-speed differential receiver in accordance with one embodiment of the present invention.

FIG. 1 presents a wide common mode high-speed differential receiver 100 using both thin and thick gate oxide MOSFETs in accordance with one embodiment of the present invention. Two PMOS transistors 102 and 104 are thick gate oxide transistors that form a source coupled differential transistor pair or input current switches that receive the differential input signals RX+ and RX−. A PMOS transistor 106 is also a thick gate oxide transistor, which is connected to the VDDH supply voltage and is a constant current source for both transistors 102 and 104. Transistor 106 may be referred to as a top current supply. Transistors 102, 104, and 106 are selected to be thick gate oxide transistors because they can operate at higher supply voltages (VDDH) while minimizing the leakage current, thereby reducing power dissipation. An NMOS transistor 108 is a thin gate oxide transistor that may be seen as a constant current source for the current path through transistors 106, 102, and 108, while an NMOS transistor 110 is also a thin gate oxide transistor that may be seen as another constant current source for the current path transistors 106, 104, and 110. The NMOS transistors 108 and 110 are referred to as bottom current supplies in view of the existence of the top current supply. Both current paths, as defined above and which will be further described in FIG. 2, are connected to VSS, or ground.

If the differential input signals RX+ and RX− are equal, then the current paths of 106, 102, 108 and 106, 104, 110 are equal, and the output signals OUT+ and OUT− are equal. If, however, the differential input signals RX+ and RX− are not equal, then the receiver 100 will amplify the difference and apply it to the output signals OUT+ and OUT−. It is noted that the output signals OUT+ and OUT− are pulled to the supply voltage VDDL by resistors 112 and 114, respectively. Due to the function of these resistors, they are referred to as current-to-voltage converters. It is further understood any other circuit module that provides such a function can replace these resistors. Moreover, the change of output signal level provides the translation of the receiver supply voltage from the input stage VDDH to the output stage VDDL. Therefore, all subsequent amplifier stages can utilize thin gate oxide transistors that operate from the supply voltage VDDL. The thin gate oxide transistors provide higher speed and gain than the thick gate oxide transistors, but cannot operate from the higher supply voltage VDDH. Since the subsequent amplifier stages can utilize the VDDL supply voltage, the overall circuit power dissipation can be reduced significantly, and no additional supply voltage translation is necessary to interface with the subsequent digital logic.

Figure 2:
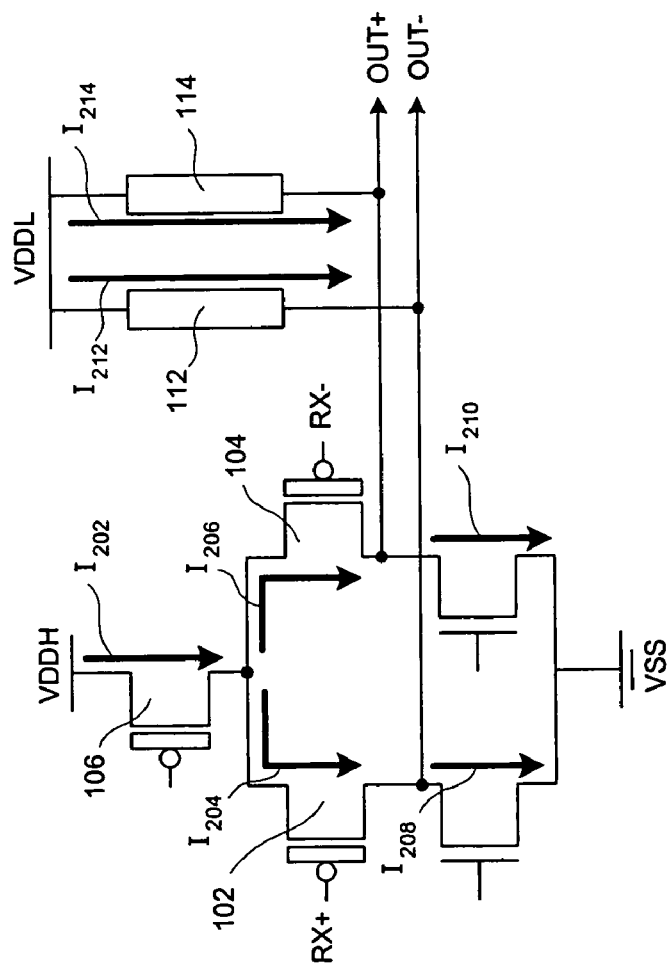
FIG. 2 presents a diagram illustrating the current flow through the wide common mode, high-speed differential receiver in accordance with one embodiment of the present invention.

FIG. 2 presents a diagram 200 that shows the current flow through the wide common mode, high-speed differential receiver 100 as presented in FIG. 1. In a static condition, with no differential input signal, the current $I_{202}$ flows from VDDH through the transistor 106 and divides equally between the transistors 102 and 104 (current $I_{204}$ and current $I_{206}$ respectively). The current $I_{208}$ is the sum of the current through the transistor 102 (current $I_{204}$) and the current through the resistor 112 (current $I_{212}$). Similarly, the current $I_{210}$ is the sum of the current through the transistor 104 (current $I_{206}$) and the current through the resistor 114 (current $I_{214}$).

Figure 3:
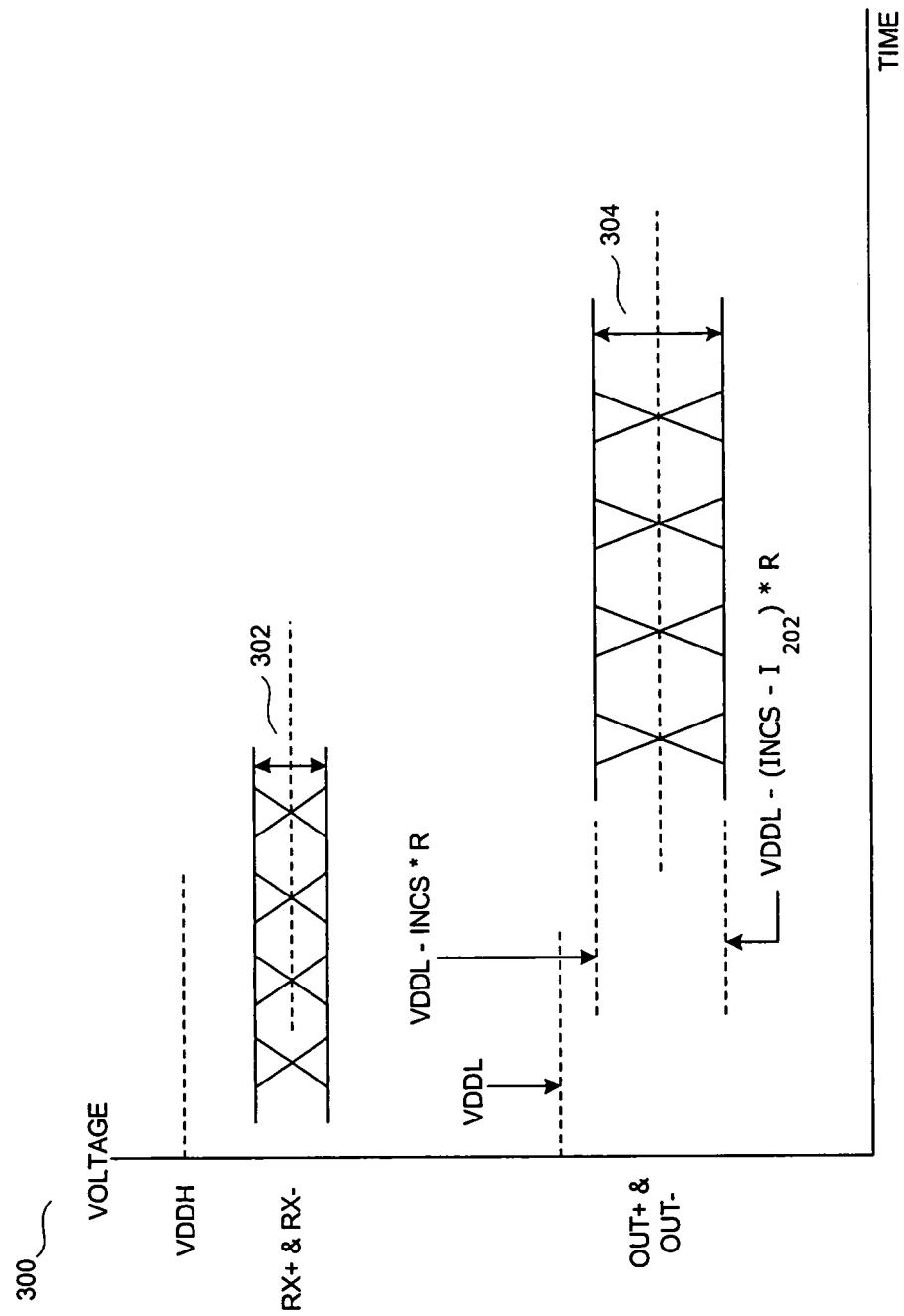
FIG. 3 presents a graph illustrating the relationship between the common mode input voltage, and the common mode output voltage, of the high-speed differential receiver, in accordance with one embodiment of the present invention.

When RX+ is lower than RX−, the transistor 102 has higher conductivity thereby allowing additional current to flow to the output signal OUT−, thereby avoiding the current path containing the transistor 104. The current through the resistors 112 and 114, as well as the voltages at the nodes OUT+ and OUT− are calculated as follows:

$I_{204}=I_{202}$ $I_{212}=I_{208}-I_{202}$ $I_{214}=I_{210}$ $V(\text{OUT}-)=VDDL-I_{212}*R_{112}=VDDL-(I_{208}-I_{202})*R_{112}$ $V(\text{OUT}+)=VDDL-I_{210}*R_{114}$ When RX+ is higher than RX−, the transistor 104 has higher conductivity, thereby allowing additional current to flow through to the output signal OUT+. The current through the resistors 112 and 114, as well as the voltages at OUT+ and OUT− are calculated as follows:

$I_{206}=I_{202}$ $I_{212}=I_{208}$ $I_{214}=I_{210}-I_{202}$ $V(\text{OUT}-)=VDDL-I_{212}*R_{112}=VDDL-I_{208}*R_{112}$ $V(\text{OUT}+)=VDDL-(I_{210}-I_{202})*R_{114}$ FIG. 3 presents a graph 300 illustrating the relationship between the common mode input voltage, and the common mode output voltage of the high-speed differential receiver 100. In this embodiment, it is assumed the current going through the bottom current sources 108 and 110 are the same, and the two resistors are of the same value too. This relationship can be mathematically represented as:

$I_{208}=I_{210}=\text{INCS}$ $R_{112}=R_{114}=R$

It can be seen from the graph 300 that the input differential signals RX+ and RX− have a common mode voltage higher than VDDL and is amplified to produce the OUT+ and OUT− signals whose common mode voltage is lower than VDDL. A range 302 illustrates the input common mode voltage swing, while a range 304 illustrates the output common mode voltage swing. The maximum output voltage is calculated as Vmax=VDDL−INCS*R while the minimum output voltage is calculated as Vmin=VDDL−(INCS−$I_{202}$)*R. Since the signals OUT+ and OUT− are lower than VDDL, the subsequent amplifier stages may utilize thin gate oxide transistor amplifiers. This results in significant power savings when compared to conventional common mode high-speed differential receivers.

Figure 4:
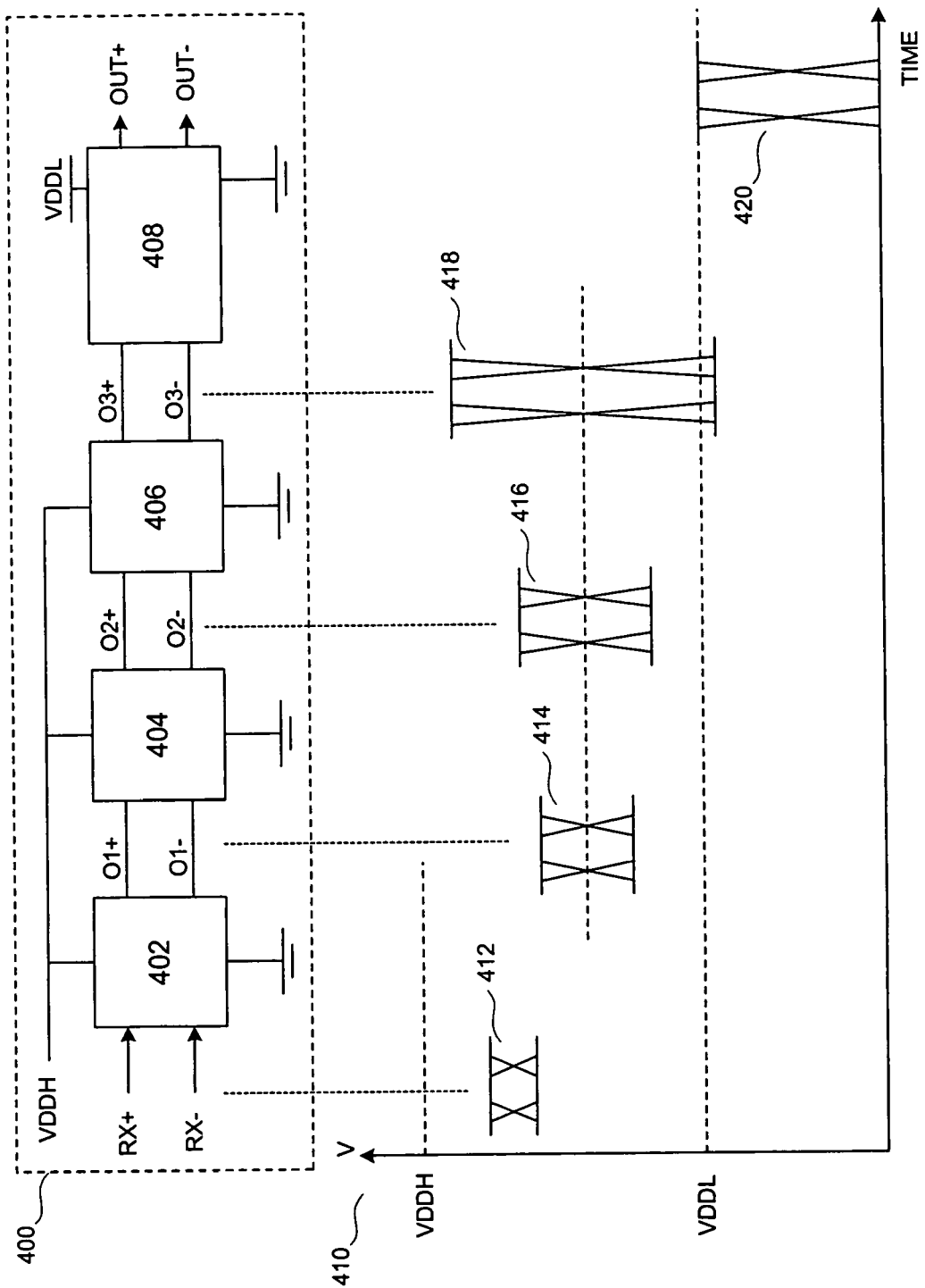
FIG. 4 illustrates the amplifier stages of a conventional "low voltage differential signal" (LVDS) receiver and the common mode voltages of the input, intermediate, and output stages of the LVDS receiver.

FIG. 4 illustrates the amplifier modules/stages of a conventional "low voltage differential signal" (LVDS) receiver 400 using thick gate oxide transistors. The common mode voltages of a pre-amplifier stage/module 402, intermediate gain stages/modules 404 and 406, and an output translation stage/module 408 of the conventional LVDS receiver 400 are also shown. Below the conventional LVDS receiver 400 is a graph 410 of the various amplifier stage signals and a comparison of their associated voltage levels. It is noted that the stages 402, 404, and 406 of the conventional LVDS receiver 400 utilize the supply voltage VDDH as well as thick gate oxide transistors. All stages utilize the same ground/VSS. The input differential signals RX+ and RX−, illustrated as signal 412, have a higher common mode voltage than VDDL, thereby requiring thick gate oxide transistors. The output signals O1+ and O1− of the pre-amplifier stage 402 are amplified as shown in signal 414, but since it also has a common mode voltage higher than VDDL, thick gate oxide transistors must still be used. The intermediate gain stages 404 and 406 further amplify and produce the differential signals O2+ and O2−, as well as O3+ and O3−, respectively. The two differential pairs are further shown as signals 416 and 418 in the graph 410. The output translation stage 408 utilizes the VDDL supply voltage to interface the conventional LVDS receiver 400 to the subsequent digital logic operating at the VDDL supply voltage. It is noted that only the output differential signals OUT+ and OUT−, which are products of the output translation stage 408 and are illustrated as signal 420 in the graph 410, have a common mode differential voltage less that VDDL. Since the stages 402, 404 and 406 utilize the supply voltage VDDH, power dissipation may be significant.

Figure 5:
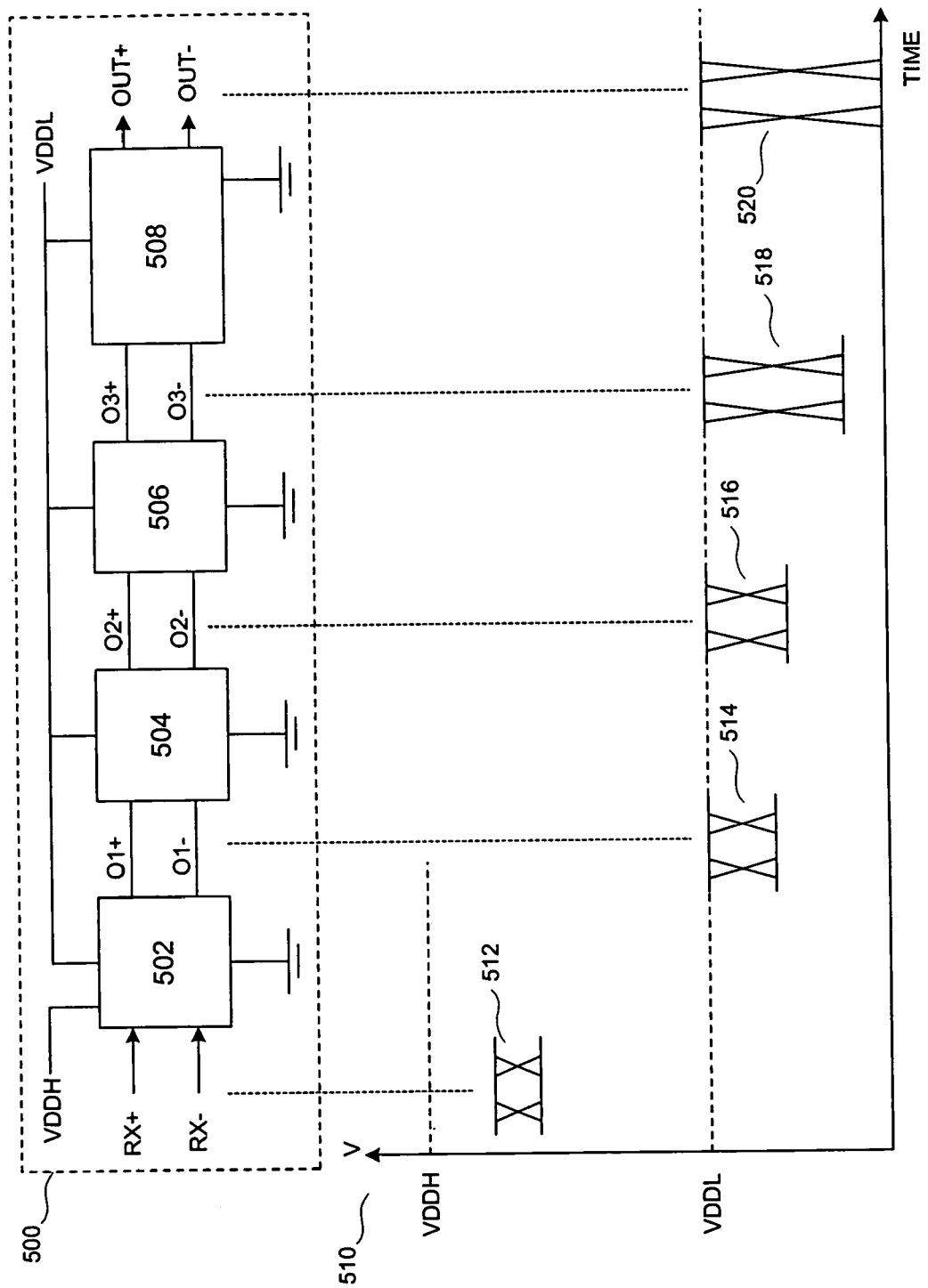
FIG. 5 illustrates the amplifier stages of the wide common mode, high-speed differential receiver, in accordance with one embodiment of the present invention.

FIG. 5 illustrates the amplifier stages of a wide common mode high-speed differential receiver 500 using both thin and thick gate oxide MOSFETs in a pre-amplifier stage 502, while using thin gate oxide transistors in all subsequent amplifier stages (e.g., intermediate gain stages 504 and 506, and output translation stage 508) in accordance with one embodiment of the present invention. The common mode voltages of the pre-amplifier stage 502, the intermediate gain stages 504 and 506, and the output translation stage 508 of the receiver 500 are also shown. Below the receiver 500 is a graph 510 of the various amplifier stage signals and a comparison of their associated voltage levels. It is noted that all stages (e.g., stages 502, 504, 506, and 508) of the receiver 500 utilize the supply voltage VDDL. The pre-amplifier 502, however, also utilizes the supply voltage VDDH. This circuit provides both the amplification of the differential signals RX+ and RX− and voltage translation from the VDDH to the VDDL supply voltage. All stages utilize the same ground VSS. Due to the fact that the voltage translation to VDDL occurs in the pre-amplifier stage 502, all subsequent stages may utilize the reduced VDDL supply voltage and hence, utilize thin gate oxide transistors. The receiver 500 significantly reduces the power dissipation when compared to the conventional design, because VDDL supply voltage is used in more stages of the receiver 500.

The input differential signals RX+ and RX− into the pre-amplifier stage 502 have a higher common mode voltage as shown by signal 512 than VDDL, which requires thick gate oxide transistors in this input stage. The output signals O1+ and O1− of the pre-amplifier stage 502 are minimally amplified as shown in signal 514, but now have a common mode voltage equal to, or lower than, VDDL, which permits the use of thin gate oxide transistors in subsequent amplifier stages. The intermediate gain stages 504 and 506 further amplify the differential signals O2+ and O2− as well as O3+ and O3−, as shown by the increasing differential signals 516 and 518 respectively. It is noted that the common mode voltage is lower than VDDL, which permits the use of thin gate oxide transistors in these amplifier stages. The output translation stage 508 of the receiver 500 may then be utilized as an additional amplifier stage before connection to the digital logic operating at the VDDL supply voltage. It is further noted that the outputs OUT+ and OUT− of the output translation stage 508 have a differential voltage that operates between 0 V and VDDL, as illustrated by signal 520.

The above invention provides many different embodiments, or embodiments for implementing different features of the invention. Specific embodiments of components and processes are described to help clarify the invention. These are, of course, merely embodiments, and are not intended to limit the invention from that described in the claims.

Although the invention is illustrated and described herein as embodied in a design and method for, it is nevertheless not intended to be limited to the details shown, since various modifications and structural changes may be made therein, without departing from the spirit of the invention, and within the scope and range of equivalents of the claims. Accordingly, it is appropriate that the appended claims be construed broadly, and in a manner consistent with the scope of the invention, as set forth in the following claims.

What is claimed is:

1. A receiver circuit with a high supply voltage and operable with additional circuits operating at a low supply voltage, the receiver circuit comprising:
  a first differential input signal controlling a first current switch;
  a second differential input signal associated with the first differential input signal controlling a second current switch;
  a top current supply connected to the high supply voltage for providing a current to be passed either through a first current path containing the first current switch and a first bottom current supply, or a second current path containing the second current switch and a second bottom current supply;
  a first current-to-voltage converter connected to the low supply voltage and in series with the first bottom current supply; and
  a second current-to-voltage converter connected to the low supply voltage and in series with the second bottom current supply;
  wherein the top current supply, the first and second bottom current supplies are controlled to assure the current passing either the first or second bottom current supply is higher than the current passing the top current supply, thereby ensuring a first voltage drop across the first current-to-voltage converter to generate a first differential output signal, and a second voltage drop across the second current-to-voltage converter to generate a second differential output signal; and
  wherein the at least one of the first or the second current switches is a thick oxide transistor and at least one of the first or the second bottom current supplies is a thin oxide transistor.

2. The receiver circuit of claim 1 wherein a common mode voltage of the input differential signals is higher than the low supply voltage and a common mode voltage of the two differential output signals is lower than the low supply voltage.

3. The receiver circuit of claim 1 wherein the top current supply is a thick oxide transistor.

4. The receiver circuit of claim 1 wherein the first and second current-to-voltage converters are resistors.

5. The receiver circuit of claim 4 wherein the two current-to-voltage converters have a same resistance.

* * * * *